US012707773B2

(12) United States Patent
Nordsell et al.

(10) Patent No.: US 12,707,773 B2
(45) Date of Patent: Aug. 11, 2026

(54) DISPLAY FRONT PANEL DEVICE

(71) Applicant: Applied Materials, Inc., Santa Clara, CA (US)

(72) Inventors: Robert Anthony Nordsell, San Jose, CA (US); Mingwei Zhu, San Jose, CA (US); Nag Patibandla, Pleasanton, CA (US); John D. Busch, San Jose, CA (US); Moon Young Shin, Kwacheon (KR); Asha Parekh, San Jose, CA (US); Hou T. Ng, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 918 days.

(21) Appl. No.: 17/522,148

(22) Filed: Nov. 9, 2021

(65) Prior Publication Data

US 2022/0149250 A1 May 12, 2022

Related U.S. Application Data

(60) Provisional application No. 63/112,489, filed on Nov. 11, 2020.

(51) Int. Cl.

*H10H 20/851* (2025.01)
*G02F 1/1335* (2006.01)
*G02F 1/13357* (2006.01)
*H01L 25/075* (2006.01)
*H01L 25/16* (2023.01)
*H10H 20/01* (2025.01)
*H10H 20/852* (2025.01)

(Continued)

(52) U.S. Cl.

CPC ........ *H10H 20/8513* (2025.01); *H10H 20/01* (2025.01); *H10H 20/856* (2025.01);

(Continued)

(58) Field of Classification Search

CPC .............. H01L 25/0753; H01L 33/504; H10H 20/8513; H10H 20/0361; H10H 20/8512; H10W 90/00

See application file for complete search history.

(56) References Cited

U.S. PATENT DOCUMENTS

2017/0294479 A1* 10/2017 Cha ........................ H10H 20/01
2017/0309798 A1 10/2017 Bonar et al.

(Continued)

FOREIGN PATENT DOCUMENTS

CN 104064658 A 9/2014
CN 108573992 A 9/2018

(Continued)

OTHER PUBLICATIONS

International Search Report and Written Opinion mailed Feb. 28, 2022 in International Patent Application No. PCT/US2021/058093, 8 pages.

*Primary Examiner* — Antonio B Crite

(74) *Attorney, Agent, or Firm* — Kilpatrick Townsend & Stockton LLP

(57) ABSTRACT

Exemplary pixel structures may include a pixel structure of a display device panel stack. The structures may include a first panel. The first panel may include a plurality of ultraviolet light sources disposed on a backplane. The structures may also include a second panel. The second panel may be coupled with the first panel. The second panel may have an inner surface facing the ultraviolet light sources. The second panel may include a transparent substrate and a down-conversion layer. The down-conversion layer may be disposed overlying the transparent substrate. The down-conversion layer may be configured to down-convert ultraviolet light into visible light. The plurality of ultraviolet light sources and the inner surface of the second panel may be separated by a distance of at least 2 μm.

14 Claims, 2 Drawing Sheets

(51) Int. Cl.

| | |
|---|---|
| ***H10H 20/856*** | (2025.01) |
| ***H10H 29/14*** | (2025.01) |
| ***H10W 90/00*** | (2026.01) |

(52) U.S. Cl.

CPC ........ *H10W 90/00* (2026.01); *H10H 20/0361* (2025.01); *H10H 20/0362* (2025.01); *H10H 20/0363* (2025.01)

(56) References Cited

U.S. PATENT DOCUMENTS

| | | | | |
|---|---|---|---|---|
| 2017/0358624 | A1* | 12/2017 | Takeya ................. | H10H 20/833 |
| 2018/0045866 | A1 | 2/2018 | Chae et al. | |
| 2018/0129121 | A1* | 5/2018 | Van Der Sijde ....... | H05B 47/11 |
| 2019/0114974 | A1 | 4/2019 | Chen | |
| 2019/0140016 | A1 | 5/2019 | Hwang et al. | |
| 2020/0144327 | A1 | 5/2020 | Lee et al. | |
| 2022/0013512 | A1* | 1/2022 | Kishimoto ......... | H10H 20/8513 |

FOREIGN PATENT DOCUMENTS

| | | | | | |
|---|---|---|---|---|---|
| CN | 109219886 | A | | 1/2019 | |
| CN | 111580301 | A | | 8/2020 | |
| CN | 111653583 | A | * | 9/2020 | ........... H10H 20/855 |
| CN | 111863925 | A | | 10/2020 | |
| KR | 20200051912 | A | | 5/2020 | |
| TW | 201947373 | A | | 12/2019 | |
| WO | 2020100303 | A1 | | 5/2020 | |
| WO | 2020183585 | A1 | | 9/2020 | |

* cited by examiner

DISPLAY FRONT PANEL DEVICE

CROSS-REFERENCE TO RELATED APPLICATIONS

This application claims the benefit of, and priority to U.S. Provisional Application Ser. No. 63/112,489, filed Nov. 11, 2020, which is hereby incorporated by reference in its entirety for all purposes.

TECHNICAL FIELD

The present technology relates to display panels. More specifically, the present technology relates to pixel structures and methods of forming pixel structures for display panels

BACKGROUND

Flat panel displays are made possible by pixel structures that produce monochromatic ultraviolet light that is subsequently down-converted into visible light. The generation of ultraviolet light and its down-conversion both generate waste heat. Furthermore, as pixel sizes continue to shrink, and pixel density increases, thermal management within the display panels becomes increasingly challenging. During operation, heat from ultraviolet light sources may raise the operating temperature of the down-conversion material, which may be sensitive to excess heat. Consequently, down-conversion efficiency and device lifetime may be negatively affected.

Thus, there is a need for improved pixel display structures and methods that can be used to produce high quality pixel structures. These and other needs are addressed by the present technology.

SUMMARY

Exemplary pixel structures may include a pixel structure of a display device panel stack. The structures may include a first panel. The first panel may include a plurality of ultraviolet light sources disposed on a backplane. The structures may also include a second panel. The second panel may be coupled with the first panel. The second panel may have an inner surface facing the ultraviolet light sources. The second panel may include a transparent substrate and a down-conversion layer. The down-conversion layer may be disposed overlying the transparent substrate. The down-conversion layer may be configured to down-convert ultraviolet light into visible light.

In some embodiments, the plurality of ultraviolet light sources and the inner surface of the second panel may be separated by a distance of at least 2 μm and less than 20 μm. The down-conversion layer may include a plurality of quantum dots disposed in a visibly transparent matrix. The second panel may include a first sub-pixel configured to down-convert ultraviolet light into visible light in a blueish spectral range. The second panel may include a second sub-pixel configured to down-convert ultraviolet light into visible light in a greenish spectral range. The second sub panel may also include a third sub-pixel configured to down-convert ultraviolet light into visible light in a reddish spectral range. The second panel may include a pixel defining structure disposed within the second panel to separate the first sub-pixel from the second sub-pixel and the second sub-pixel from the third sub-pixel. The pixel defining structure may further separates the plurality of ultraviolet light sources. A first light source of the plurality of ultraviolet light sources may be configured to illuminate the first sub-pixel. A second light source of the plurality of ultraviolet light sources may be configured to illuminate the second sub-pixel. A third light source of the plurality of ultraviolet light sources may be configured to illuminate the third sub-pixel. The plurality of ultraviolet light sources may be or include individually addressable light emitting diodes.

Some embodiments of the present technology may encompass methods of forming a pixel structure of a display device panel stack. The methods may include forming a down-conversion panel comprising a plurality of sub-pixels. The plurality of sub-pixels may be configured to down-convert ultraviolet light into a plurality of visible wavelength bands. The method may also include disposing a light array panel overlying the down-conversion panel. The light array panel may include a plurality of individually addressable ultraviolet light sources. An inner surface of the down-conversion panel may be separated from the plurality of ultraviolet light sources by a distance of at least 2 μm.

In some embodiments, the distance may be less than 20 um. Forming the down-conversion panel may include forming a pixel defining structure on a transparent substrate, the pixel defining structure defining the plurality of sub-pixels. Forming the down-conversion panel may include forming a color filter layer overlying the transparent substrate in each sub-pixel of the plurality of sub-pixels. Forming the down-conversion panel may include forming an ultraviolet blocking layer overlying the color filter layer in each sub-pixel of the plurality of sub-pixels. Forming the down-conversion panel may include forming a down-conversion layer overlying the ultraviolet blocking layer in each sub-pixel of the plurality of sub-pixels. The down-conversion layer may be configured to down-convert ultraviolet light into visible light. Forming the down-conversion layer may include depositing a first uncured matrix including a first plurality of quantum dots into a first subset of the plurality of sub-pixels. The first plurality of quantum dots may be selected to down-convert ultraviolet light into blueish visible light. Forming the down-conversion layer may include depositing a second uncured matrix including a second plurality of quantum dots into a second subset of the plurality of sub-pixels. The second plurality of quantum dots may be selected to down-convert ultraviolet light into greenish visible light. Forming the down-conversion layer may include depositing a third uncured matrix including a third plurality of quantum dots into a third subset of the plurality of sub-pixels. The third plurality of quantum dots may be selected to down-convert ultraviolet light into reddish visible light. Forming the down-conversion layer may also include curing the down-conversion layer. Forming the down-conversion panel may include disposing an encapsulation layer overlying the down-conversion layer. The inner surface of the down-conversion panel may be formed by an outer surface of the encapsulation layer. Forming the pixel defining layer may be include forming a black matrix defining the plurality of sub-pixels. The method may include depositing a reflective film overlying the black matrix, the reflective film being reflective of visible light.

Some embodiments of the present technology may encompass pixel structures. The structures may include a first panel. The first panel may include a plurality of ultraviolet light sources disposed on a backplane. The plurality of ultraviolet light sources may be individually addressable. The structures may also include a second panel, coupled with the first panel. The second panel may have an inner surface facing the ultraviolet light sources. The second panel may include a transparent substrate. The second panel may include a pixel defining structure defining a plurality of sub-pixels on the transparent substrate. The second panel may also include a down-conversion layer overlying the transparent substrate in each sub-pixel. The down-conversion layer may include a phosphor material of a plurality of phosphor materials configured to down-convert ultraviolet light into visible light. The plurality of ultraviolet light sources and the inner surface of the second panel may be separated by a distance of at least 2 μm and less than 20 μm.

In some embodiments, the transparent substrate may be or include glass. For a first subset of the plurality of sub-pixels, the phosphor material may be configured to down-convert ultraviolet light into blueish visible light. For a second subset of the plurality of sub-pixels, the phosphor material may be configured to down-convert ultraviolet light into greenish visible light. For a third subset of the plurality of sub-pixels, the phosphor material may be configured to down-convert ultraviolet light into reddish visible light. The pixel defining structure may be or include black matrix. The pixel defining structure may further include a reflective film disposed on the black matrix.

Such technology may provide numerous benefits over conventional systems and techniques. For example, the systems may improve the effective lifetime of pixel display panels. Additionally, the operations of embodiments of the present technology may produce improved display performance at least in part by reducing the operating temperature of a down-conversion material. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
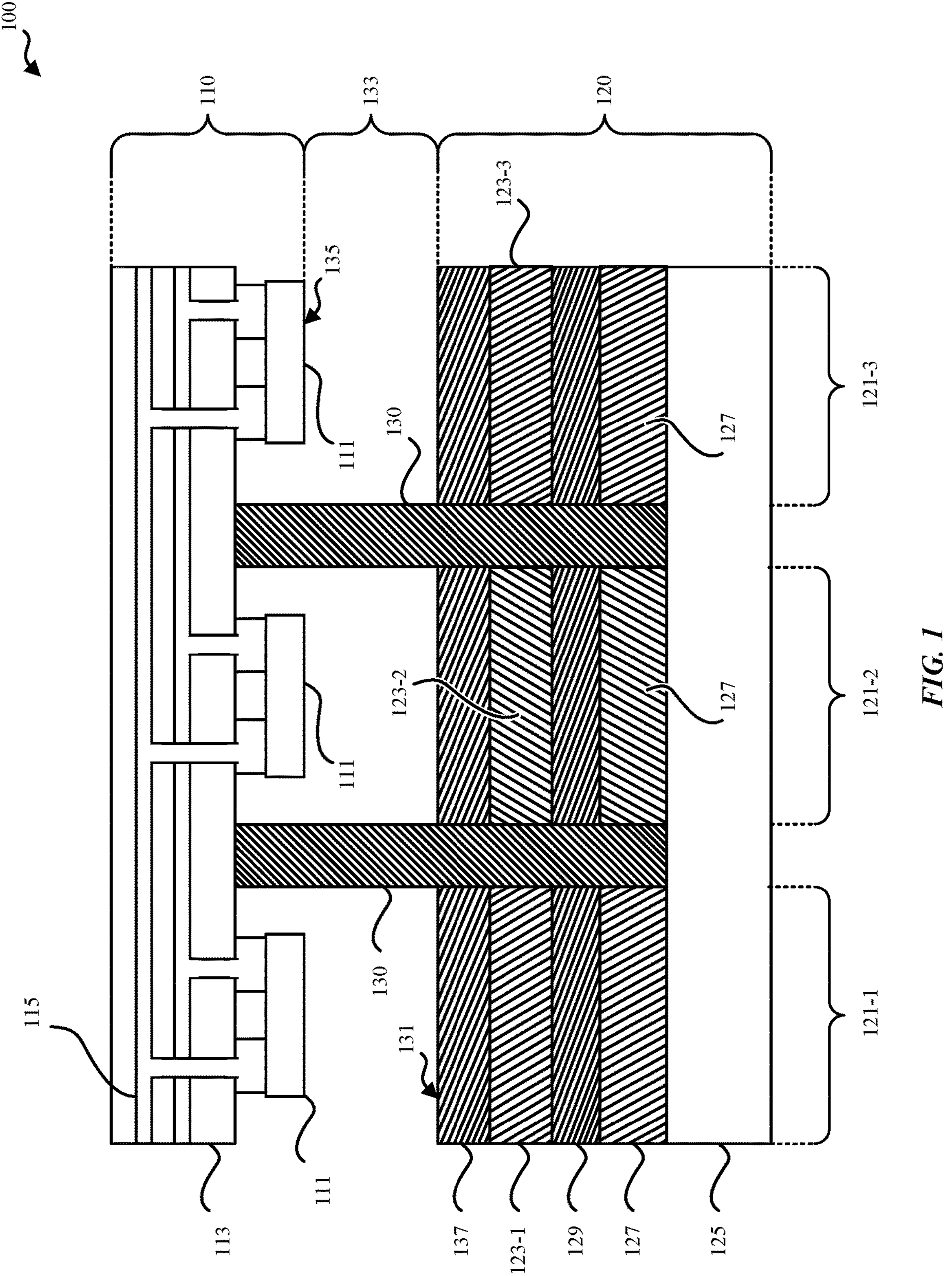
FIG. 1 shows a schematic cross-sectional view of an exemplary pixel structure of a display device panel stack according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During operation of a display panel device operating by the principle of ultraviolet (UV) down-conversion, heat may accumulate within materials that serve to absorb UV photons and emit visible photons. Thermal sensitivity of such materials may result in heat-induced degradation of a down-conversion layer incorporated into a pixel structure of the display panel device. Furthermore, transmission of UV photons through down-conversion layers may damage color filters or other constituent layers. Absorption of UV into structures may induce additional heating of the down-conversion panel and subsequent thermal degradation.

Conventional technology has often accepted thermal degradation as a physical constraint on display device lifetime and operational limits. The present technology, however, may implement different structures to reduce the impact of heat loading on down-conversion materials. For example, the present technology may include pixel structures including a pixel-defining structure separating a light source panel and a down-conversion panel, such that heat conduction between the two panels is minimized. Additionally, the down-conversion panel may include reflective layers that may improve the down-conversion efficiency and further reduce heat accumulation during operation.

Conventional techniques have addressed these issues by often utilizing thermal management techniques. Thermal management may include various operational techniques, such as managing a duty cycle of a pixel structure by pulsing light sources at a frequency beyond a threshold of visual recognition, or by adapting the intensity of a display to ambient conditions. Even so, heat load may limit the color fidelity and the effective lifetime of the pixel structure. The present technology may overcome these limitations by reducing the heat load on the down-conversion panel, for example, by limiting heat transfer between the light sources and the down-conversion material to a substantially radiative pathway, rather than through conduction. While specific methodology and component configurations may be discussed, it is to be understood that the present technology is not intended to be limited to the specific structures and processes discussed, as the techniques described may be used to improve a number of pixel structures and formation processes, and may be applicable to a variety of display devices and manufacturing techniques.

FIG. 1 shows a schematic cross-sectional view of an exemplary pixel structure 100 of a display device panel stack according to some embodiments of the present technology. The pixel structure 100 may be incorporated in a display device including control electronics and power systems to facilitate its use as an addressable pixel in a display. Pixel structure 100 may show a partial view of the structures and components being discussed, and may illustrate a view across a cross section of a display pixel, which may otherwise include any number of pixel structures to form a display panel including as many as millions of individually addressable pixels or more. Any aspect of pixel structure 100 may also be incorporated with other display systems as will be readily understood by the skilled artisan.

Pixel structure 100 may include two panels providing complementary functionality, permitting the pixel structure 100 to emit visible light with a sum-spectrum in a broad color spectrum and over a broad range of intensities. As illustrated, the pixel structure 100 may include a first panel 110 and a second panel 120. The first panel 110 may be or include a light source panel, including ultraviolet (UV) light sources 111, such as light emitting diodes (LEDs) configured to emit light in an ultraviolet range. For example, the UV light sources 111 may emit in the UV-A range between 315 nm and 400 nm, for example, at or about a wavelength of 400 nm or less, at or about a wavelength of 390 nm or less, at or about a wavelength of 380 nm or less, at or about a wavelength of 370 nm or less, at or about a wavelength of 360 nm or less, at or about a wavelength of 350 nm or less, at or about a wavelength of 340 nm or less, at or about a wavelength of 330 nm or less, at or about a wavelength of 320 nm or less, or less. Similarly, the UV light sources 111 may emit in the UV-B range between 280 nm and 315 nm, for example, at or about a wavelength of 315 nm or less, at or about a wavelength of 305 nm or less, at or about a wavelength of 295 nm or less, at or about a wavelength of 285 nm or less, or less. Similarly, the UV light sources 111 may emit in the UV-C range between 100 nm and 280 nm, for example, at or about a wavelength of 280 nm or less, at or about a wavelength of 270 nm or less, at or about a wavelength of 260 nm or less, at or about a wavelength of 250 nm or less, at or about a wavelength of 240 nm or less, or less. The emission wavelength of the UV light sources 111 may be monochromatic, meaning that each source may emit at a single peak wavelength. The peak wavelength may be the same for the UV light sources 111, such that each of the UV light sources 111 may produce a substantially equivalent emission spectrum. Alternatively, different UV light sources 111 may produce a different emission spectrum, for example, in relation to material parameters of the components of the second panel 120.

To facilitate the individual addressability of the UV light sources 111, the UV light sources 111 may be disposed on a backplane 113. The backplane may be or include a multilayer structure, for example, being formed by processes including deposition, etching, and removal forming part of semiconductor fabrication operations. In some embodiments, the backplane 113 may be formed including metallized contacts 115. The contacts 115 may be or include metal thin films, such as those deposited by chemical or physical vapor deposition processes. The contacts 115 may provide electronic communication between the UV light sources 111 and a display controller and a power system, by which the UV light sources 111 may be individually addressed. Individual addressability of each UV light source 111 of the UV light sources 111 may facilitate the functionality of the pixel structure 100 as an emitter of visible light across a broad spectral range, from deep bluish to deep reddish wavelengths.

The second panel 120 may include a multilayer structure configured to down-convert UV light into visible light that may reproduce the broad spectral range by combining substantially monochromatic light emitted by multiple sub-pixels. For example, the second panel 120 of the pixel structure 100 may include, but is not limited to, a first sub-pixel 121-1, a second sub-pixel 121-2, and a third sub-pixel 121-3. The sub-pixels may be configured to down-convert visible light from UV light at or about three or more principle wavelengths within multiple wavelength ranges, such that the pixel structure 100 may emit visible light of an arbitrary color within the broad spectral range. For example, the first sub-pixel 121-1 may be configured to down-convert UV light to emit visible light in a bluish wavelength range, between about 380 nm and 550 nm. Similarly, the second sub-pixel 121-2 may be configured to down-convert UV light to emit visible light in a greenish wavelength range, between about 400 nm and 700 nm. Similarly, the third sub-pixel 121-3 may be configured to down-convert UV light to emit visible light in a reddish wavelength range, between about 425 nm and 700 nm. In some embodiments, the first sub-pixel 121-1 is configured to emit bluish visible light centered around a peak wavelength at or about 475 nm, the second sub-pixel 121-2 is configured to emit greenish visible light centered around a peak wavelength at or about 560 nm, and the third sub-pixel 121-3 is configured to emit reddish visible light centered around a peak wavelength at or about 640 nm. In some embodiments, the sub-pixels are configured to emit visible light within a relatively narrow wavelength distribution, as measured by a full width at half maximum spectral bandwidth each respective sub-pixel. For example, the FWHM of each sub-pixel may be about 40 nm or less, about 30 nm or less, about 25 nm or less, about 20 nm or less, or less.

To produce visible light in multiple wavelength ranges each sub-pixel may include down-conversion layers 123 incorporating a material selected to absorb UV light emitted by the UV light sources 111 and to emit visible light at a longer wavelength. For example, a first down-conversion layer 123-1 may incorporate quantum dots, phosphors, or other materials selected to absorb UV photons and to emit visible photons in the bluish visible wavelength range. Similarly, a second down-conversion layer 123-2 and a third down-conversion layer 123-3 may incorporate such materials to down-convert UV photons into visible photons in the greenish and reddish visible wavelength ranges, respectively. In addition to the down-convertor material, the down-conversion layers 123 may incorporate a transparent matrix within which the down-convertor material may be suspended. For example, in the case of quantum dot down-convertor material, a plurality of quantum dots may be suspended in a transparent matrix. To potentially improve the down-conversion efficiency of the down-conversion layers 123, the down-conversion layers 123 may include a scattering material to reduce through-transmission of UV photons and to increase the fraction of UV photons that interact with the down-convertor material. As an example, the down-conversion layers may incorporate titanium oxide nanoparticles suspended in the transparent matrix, which may act to scatter the incident UV photons and increase interactions between UV photons and the down-convertor material.

The down-conversion panel 120 may also include layers to condition light before it is emitted and to provide structural support for the pixel structure 100. For example, the down-conversion panel 120 may include a transparent substrate 125, which may be or include, but is not limited to, glass or plastic, such that the transparent substrate 125 is transparent to visible light. In some embodiments, the transparent substrate may be or include a material that is selectively transparent in the visible wavelength range, but absorbs broadly in the UV range. Overlying the transparent substrate 125, the pixel structure 100 may include one or more coatings or intermediate layers including color filter layers 127 or UV blocking layers 129. The color filter layers 127 may be or include materials selected to filter light by wavelength, such that light outside a pre-defined spectral range may be removed prior to emission from the respective sub-pixel 121. For example, the color filter layer 127 may be or include a long-pass filter material, a short-pass filter material, or a band-pass filter material, such that light outside a pre-defined wavelength range may be removed. Materials for the color filter layer 127 may include thermoplastic or other polymeric materials. Additionally or alternatively, the color filter layer 127 may incorporate dichroic filter coatings, such that UV light and light outside the pre-defined wavelength range may be reflected back into the down-conversion layer 123, which may improve the conversion efficiency of the down-conversion layer 123. In some cases, the UV blocking layer 129 may protect the color filter layer 127 by limiting exposure of the constituent materials to UV light transmitted through the down-conversion layer 123 of a sub-pixel 121. For example, a polymeric color filter material may be sensitive to UV light, which may degrade the color filter layer 123 over a period of time. In this way, the UV blocking layer, which may be or include thin films of polymeric materials, borosilicate materials, or other materials selected to block photons with a wavelength of about 400 nm or less.

In some embodiments, the pixel structure 100 may include a pixel-defining structure 130. While in FIG. 1 the pixel-defining structure is illustrated as two discrete elements orthogonal to the first panel 110 and the second panel 120, the pixel-defining structure 130 may include a continuous structure defining the sub-pixels 121 in three dimensions. For example, the pixel-defining structure may include a continuous array of rectangular cells, illustrated in cross-section in FIG. 1, such that the constituent layers of the down-conversion panel 120 form rectangular planar layers substantially parallel to the transparent substrate. The pixel-defining structure 130 may extend proud of an inner surface 131 of the second panel 120, such that the first panel may be coupled with the second panel 120 through the pixel-defining structure 130. In some embodiments, the pixel structure 100 may include additional pixel-defining structures, as when, for example, the pixel-defining structures are not continuous, but rather are formed from multiple discrete structures.

In some embodiments, the transparent substrate 125 may have a thickness greater than or about 25 μm and less than or about 1 mm. The thickness of the transparent substrate 125 may be greater than or about 50 μm, be greater than or about 75 μm, be greater than or about 100 μm, be greater than or about 200 μm, be greater than or about 300 μm, be greater than or about 400 μm, be greater than or about 500 μm, be greater than or about 600 μm, be greater than or about 700 μm, be greater than or about 800 μm, be greater than or about 900 μm, or greater, and less than or about 1 mm.

In some embodiments, the color filter layer 127 may have a thickness greater than or about 1 μm and less than or about 20 μm. The thickness of the color filter layer 127 may be greater than or about 2 μm, greater than or about 3 μm, greater than or about 4 μm, greater than or about 5 μm, greater than or about 6 μm, greater than or about 7 μm, greater than or about 8 μm, greater than or about 9 μm, greater than or about 10 μm, greater than or about 11 μm, greater than or about 12 μm, greater than or about 13 μm, greater than or about 14 μm, greater than or about 15 μm, greater than or about 16 μm, greater than or about 17 μm, greater than or about 18 μm, greater than or about 19 μm, or greater, and less than or about 20 μm.

In some embodiments, the UV blocking layer 129 may have a thickness greater than or about 0.5 μm and less than or about 50 μm. The thickness of the UV blocking layer 129 may be greater than or about 1 μm, greater than or about 5 μm, greater than or about 10 μm, greater than or about 15 μm, greater than or about 20 μm, greater than or about 25 μm, greater than or about 30 μm, greater than or about 35 μm, greater than or about 40 μm, greater than or about 45 μm, or greater, and less than or about 50 μm. In some embodiments, UV blocking layer 129 may have a thickness less than or about 1 mm, less than or about 0.9 mm, less than or about 0.8 mm, less than or about 0.7 mm, less than or about 0.6 mm, less than or about 0.5 mm, less than or about 0.4 mm, less than or about 0.3 mm, less than or about 0.2 mm, less than or about 0.1 mm, or less.

In some embodiments, the down-conversion layers 123 may have a thickness greater than or about 1 μm and less than or about 50 μm. The thickness of the UV blocking layer 129 may be greater than or about 1 μm, greater than or about 5 μm, greater than or about 10 μm, greater than or about 15 μm, greater than or about 20 μm, greater than or about 25 μm, greater than or about 30 μm, greater than or about 35 μm, greater than or about 40 μm, greater than or about 45 μm, or greater, and less than or about 50 μm.

In some embodiments, the encapsulation layer 137 may have a thickness greater than or about 10 nm and less than or about 20 μm. The thickness of the UV blocking layer 129 may be greater than or about 10 nm, greater than or about 50 nm, greater than or about 100 nm, greater than or about 250 nm, greater than or about 500 nm, greater than or about 1 μm, greater than or about 5 μm, greater than or about 10 μm, greater than or about 15 μm, and less than or about 20 μm.

In some embodiments, the first panel 110 and the second panel 120 may be separated by a distance 133. The distance 133 may describe a separation between the inner surface 131 of the second panel and a plane aligned with an emission surface 135 of the UV light sources 111.

In some embodiments, the distance 133 may be less than or about 30 μm, less than or about 28 μm, less than or about 26 μm, less than or about 24 μm, less than or about 22 μm, less than or about 20 μm, less than or about 18 μm, less than or about 16 μm, less than or about 14 μm, less than or about 12 μm, less than or about 10 μm, less than or about 8 μm, less than or about 6 μm, less than or about 4 μm, less than or about 2 μm, less than or about 1 μm, less than or about 0.5 μm, less than or about 0.2 μm, less than or about 0.1 μm, less than or about 0.05 μm, less than or about 0.01 μm, or less. Advantageously, separating the first panel 110 from the second panel 120 by the distance 133 may improve the lifetime of the pixel structure 100. Without being bound to a particular physical mechanism or principal, the improvement may be attributable to reduced heat load on the second-panel 120 by limiting heat conduction from the UV light sources 111 into the down-conversion layers 123. As the down-convertor material incorporated into the down-conversion layers 123, such as quantum dots or phosphors, may be thermally sensitive, reducing the heat load on the second panel may improve the effective lifetime of the pixel structure. Furthermore, with frequent or relatively high intensity operation of the pixel structure 100, the emission spectrum of the down-convertor material may shift, for example, may red-shift, as the temperature of the down-conversion layer 123 increases. As such, reducing heat load on the second panel 120 may also improve the color reproduction of the pixel structure 100 may be improved by thermal management of the second panel.

To protect the constituent layers of the second panel 120, an encapsulation layer 137 may be disposed overlying the down-conversion layer 123 in each sub-pixel 121. The encapsulation layer 137 may be or include a material selected for impermeability to oxygen and other oxidizing chemical species that may degrade the down-conversion layer. For example, UV light emitted by the UV light sources 111 may generate ozone in proximity to the second panel, when a gas between the first panel 110 and the second panel 120 includes trace oxygen or water vapor. Ozone, being a reactive gas, may permeate and oxidize the second panel. The encapsulation layer 137 may be or include UV transparent polymers such as polydimethyl siloxane (PDMS), poly(methyl methacrylate), silicones, polystyrenes, polycarbonates, or cyclo-olefin polymers. The encapsulation layer 137 may be or include inorganic materials including, but not limited to, zinc oxide, silicon nitride, aluminum oxide or titanium oxide.

The pixel-defining structure 130 may be or include a black matrix material, where the term black matrix describes a material formulated from a photosensitive acrylic resin and color pigments, producing a structure characterized by low specular reflection over a broad wavelength range including, but not limited to, UV and visible wavelengths. In this way, the pixel-defining structures 130 may define the sub-pixels 121, isolate the sub-pixels 121 from each other, and improve the precision and accuracy of color reproduction of the pixel structure 100. In some embodiments, the pixel-defining structures may include a reflective coating over at least a portion of the surfaces facing the constituent layers of the sub-pixels 121 and the UV light sources 111. Advantageously, as the down-convertor material may act as an isotropic emitter, the reflective coating may further improve the efficiency of the pixel structure 100 by increasing the fraction of UV light reaching the down-conversion layers 123 and the fraction of visible light emitted by the sub-pixels 121.

Figure 2:
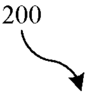
FIG. 2 shows exemplary operations in a method of forming a pixel structure of a display device panel stack according to some embodiments of the present technology.
Figure 2:
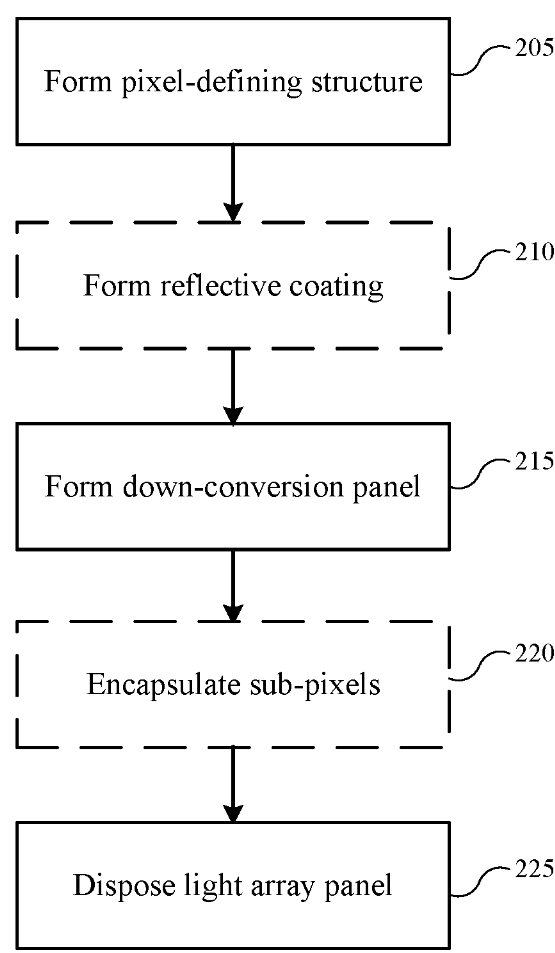

FIG. 2 shows exemplary operations in a method 200 of deposition according to some embodiments of the present technology. The method may be performed in one or more environments or systems devised for display device fabrication, and which may include any components, or utilize any methodology suitable for fabricating the structures described. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. For example, and as described previously, operations may be performed prior to delivering a substrate into a fabrication system, in which method 200 may be performed to form a pixel structure, such as the pixel structure 100 of FIG. 1.

In some embodiments, the method 200 may include forming a pixel-defining structure overlying a transparent substrate at operation 205, as part of forming a down-conversion panel of the pixel structure 100. In the context of the pixel structure 100, the down-conversion panel corresponds to the second panel 120. The pixel-defining structure may define forms multiple sub-pixels. The sub-pixels may be rectangular in cross-section, but may include other shapes such as ellipsoid, circular, or polygonal. Forming the pixel-defining structure may include operations such as printing a black matrix material onto the transparent substrate and curing the black matrix material, as by layer-wise additive manufacturing. In some cases, the pixel-defining structures may be formed by subtractive methods, such as through deposition and patterned removal of resist layers followed by deposition of black matrix material, followed by removal of the resists to define the sub-pixels.

In some embodiments, forming the pixel-defining structure may optionally include forming a reflective coating at operation 210. The reflective coating, which may be or include reflective metal film, polymeric films, or dielectric mirror films, may be formed by a deposition process subsequent forming the pixel-defining layer. As the pixel-defining layer may be inherently absorptive, as when it is or includes black matrix material, the reflective coating may improve the efficiency of the down-conversion panel by increasing the fraction of UV photons that reach the down-conversion layers, and by increasing the fraction of visible photons that are emitted by the transparent substrate. Furthermore, the reflective coating may improve thermal management of the down-conversion panel, by reducing the absorption of light into the pixel-defining structure, thereby limiting the conversion of photons into phonons through absorption.

In some embodiments, method 200 may include forming a down-conversion panel at operation 215, including the sub-pixels defined at operation 205. Operation 205 may include various processing techniques for forming optical thin films under clean conditions. These techniques may include, but are not limited to, printing, patterned deposition, multilayer deposition facilitated by curing and planarization, or other techniques that form processes used for fabrication of display panel structures. In some embodiments, operation 205 may be implemented in a controlled environment, for example, in a glove box, such that components and materials are not exposed to oxidizing gases or water vapor.

Forming the down-conversion panel at operation 215 may include forming a down-conversion layer. Forming the down-conversion layer may include depositing different down-convertor materials, such as quantum dots or phosphors, into the different sub-pixels. In this way, each sub-pixel may be configured to absorb UV light and emit visible light in a wavelength range. For example, a first plurality of quantum dots may be selected to down-convert ultraviolet light into blueish visible light, a second plurality of quantum dots selected to down-convert ultraviolet light into greenish visible light, and a third plurality of quantum dots selected to down-convert ultraviolet light into reddish visible light. Operation 215 may also include curing the down-conversion layer, as when the down-convertor material includes a matrix that is photo-cured. Following curing, the down-conversion layer may form a layer that is transparent to UV and visible light, and that may further include a scattering medium, such as titanium oxide nanoparticles suspended throughout the layer.

Operation 215 may further include forming a color filter layer overlying the transparent substrate in each sub-pixel of the down-conversion panel. Additionally, operation 215 may include forming an UV blocking layer overlying the color filter layer in each sub-pixel of the down-conversion panel. As with the deposition of the pixel-defining layer and the down-conversion layer, the color filter layer or the UV blocking layer may be formed by layer-wise printing processes, thin film deposition processes, additive processes, or subtractive processes. Similarly, photo curing may be implemented to cross-link polymeric matrix materials making up the layers, and to form discrete layers prior to deposition of subsequent overlying layers. In this way, the down-conversion panel may be formed by a series of operations for each sub-pixel including, but not limited to, forming the color filter layer overlying the transparent substrate, curing the color filter layer, forming the UV blocking layer overlying the color filter layer, curing the UV blocking layer, forming the down-conversion layer, and curing the down-conversion layer. In some embodiments, method 200 may optionally include encapsulating the sub-pixels at operation 220. Encapsulating the sub-pixels of the down-conversion panel may include disposing an encapsulation layer overlying the down-conversion layer. The encapsulation layer may be or include a substantially UV-transparent polymer material, which may be deposited as a thin film overlying the sub-pixels under controlled conditions.

Subsequent forming the down-conversion panel at operation 220, operation 225 includes disposing a light array panel overlying the down-conversion panel. As described in detail in reference to FIG. 1, the light array panel may include a backplane and multiple UV light sources arranged to illuminate each sub-pixel of the down-conversion layer.

As such, disposing the light array panel overlying the down-conversion panel may include coupling the light array panel with the down-conversion panel through the pixel-defining structure. In this way, an inner surface of the down-conversion panel may be separated from the plurality of UV light sources by a distance. As described above, the distance may describe a spacing between the an upper surface of the encapsulation layer and an emission surface of the UV light sources.

Subsequent operation 225, additional processes may be undertaken to incorporate the pixel structure into a display panel device. For example, the light array panel may be electrically coupled to control and power circuits. The pixel structure may be housed in an enclosure as part of a display with as many as millions of pixels, billions of pixels, or more. In this way, the pixel structure may be used as an individually addressable pixel as part of the operation of the display device.

By utilizing methods and components according to embodiments of the present technology, display panel devices incorporating UV down-conversion may be improved. By providing an improved thermal management, and improved down-conversion efficiency, display panel devices may exhibit improved pixel lifetime and operating parameters. These improvements may include reduced power consumption and improved display performance. Additionally, by reducing heat load on the down-conversion materials, color reproduction may be improved during frequent or high intensity use.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A pixel structure of a display device panel stack, comprising:

a first panel, comprising a plurality of ultraviolet light sources disposed on a backplane, wherein the plurality of ultraviolet light sources comprise individually addressable light emitting diodes; and a second panel, coupled with the first panel, the second panel having an inner surface facing the ultraviolet light sources, wherein the plurality of ultraviolet light sources and the inner surface of the second panel are separated by a distance of at least 2 μm and less than 20 μm, the second panel comprising:

a plurality of subpixels;

a pixel defining structure disposed within the second panel to separate the plurality of subpixels from each other, wherein the pixel defining structure extends from the inner surface of the second panel to contact the backplane of the first panel;

a visibly transparent substrate; and a down-conversion layer disposed overlying the visibly transparent substrate, the down-conversion layer configured to down-convert ultraviolet light into visible light.

2. The pixel structure of claim 1, wherein the down-conversion layer comprises a plurality of quantum dots disposed in a visibly transparent matrix.

3. The pixel structure of claim 1, wherein the plurality of subpixels comprises:

a first sub-pixel configured to down-convert ultraviolet light into visible light in a blueish spectral range;

a second sub-pixel configured to down-convert ultraviolet light into visible light in a greenish spectral range; and a third sub-pixel configured to down-convert ultraviolet light into visible light in a reddish spectral range.

4. The pixel structure of claim 3, wherein the pixel defining structure further separates the plurality of ultraviolet light sources, and wherein:

a first light source of the plurality of ultraviolet light sources is configured to illuminate the first sub-pixel;

a second light source of the plurality of ultraviolet light sources is configured to illuminate the second sub-pixel; and a third light source of the plurality of ultraviolet light sources is configured to illuminate the third sub-pixel.

5. A method of forming a pixel structure of a display device panel stack, the method comprising:

forming a down-conversion panel comprising a plurality of sub-pixels, the plurality of sub-pixels configured to down-convert ultraviolet light into a plurality of visible wavelength bands;

forming a pixel defining structure on the down-conversion panel, the pixel defining structure defining the plurality of sub-pixels; and disposing a light array panel overlying the down-conversion panel, the light array panel comprising a plurality of individually addressable ultraviolet light sources, wherein an inner surface of the down-conversion panel is separated from the plurality of individually addressable ultraviolet light sources by a distance of at least 2 μm, and the pixel defining structure extends from the inner surface of the down-conversion panel to contact the light array panel.

6. The method of claim 5, wherein the distance is less than 20 μm.

7. The method of claim 5, wherein forming the down-conversion panel comprises:

forming a color filter layer overlying a transparent substrate in each sub-pixel of the plurality of sub-pixels;

forming an ultraviolet blocking layer overlying the color filter layer in each sub-pixel of the plurality of sub-pixels;

forming a down-conversion layer overlying the ultraviolet blocking layer in each sub-pixel of the plurality of sub-pixels, the down-conversion layer configured to down-convert ultraviolet light into visible light.

8. The method of claim 7, wherein forming the down-conversion layer comprises:

depositing a first uncured matrix comprising a first plurality of quantum dots into a first subset of the plurality of sub-pixels, the first plurality of quantum dots selected to down-convert ultraviolet light into blueish visible light;

depositing a second uncured matrix comprising a second plurality of quantum dots into a second subset of the plurality of sub-pixels, the second plurality of quantum dots selected to down-convert ultraviolet light into greenish visible light;

depositing a third uncured matrix comprising a third plurality of quantum dots into a third subset of the plurality of sub-pixels, the third plurality of quantum dots selected to down-convert ultraviolet light into reddish visible light; and curing the down-conversion layer.

9. The method of claim 8, wherein forming the down-conversion panel comprises:

disposing an encapsulation layer overlying the down-conversion layer, wherein the inner surface of the down-conversion panel is formed by an outer surface of the encapsulation layer.

10. The method of claim 7, wherein forming the pixel defining structure comprises forming a black matrix defining the plurality of sub-pixels.

11. The method of claim 10, further comprising depositing a reflective film overlying the black matrix, the reflective film being reflective of visible light.

12. A pixel structure of a display device panel stack, comprising:

a first panel, comprising a plurality of ultraviolet light sources disposed on a backplane, the plurality of ultraviolet light sources being individually addressable; and a second panel, coupled with the first panel, the second panel having an inner surface facing the ultraviolet light sources, the second panel comprising:

a transparent substrate;

a pixel defining structure defining a plurality of sub-pixels on the transparent substrate, wherein the pixel defining structure comprises a reflective film disposed on a black matrix; and a down-conversion layer overlying the transparent substrate in each sub-pixel, the down-conversion layer comprising a phosphor material of a plurality of phosphor materials configured to down-convert ultraviolet light into visible light, wherein the plurality of ultraviolet light sources and the inner surface of the second panel are separated by a distance of at least 2 μm and less than 20 μm.

13. The pixel structure of claim 12, wherein the transparent substrate comprises glass.

14. The pixel structure of claim 12, wherein:

for a first subset of the plurality of sub-pixels, the phosphor material is configured to down-convert ultraviolet light into blueish visible light;

for a second subset of the plurality of sub-pixels, the phosphor material is configured to down-convert ultraviolet light into greenish visible light; and for a third subset of the plurality of sub-pixels, the phosphor material is configured to down-convert ultraviolet light into reddish visible light.

* * * * *